(12) United States Patent
Chang et al.

(10) Patent No.: US 8,606,549 B2
(45) Date of Patent: Dec. 10, 2013

(54) METHOD OF SIMULATING ILLUMINATED ENVIRONMENT FOR OFF-LINE PROGRAMMING

(75) Inventors: Chih-Kuang Chang, New Taipei (TW); Xin-Yuan Wu, Shenzhen (CN); Jin-Gang Rao, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 222 days.

(21) Appl. No.: 13/217,287

(22) Filed: Aug. 25, 2011

(65) Prior Publication Data

US 2012/0173206 A1 Jul. 5, 2012

(30) Foreign Application Priority Data

Dec. 31, 2010 (CN) .......................... 2010 1 0617983

(51) Int. Cl.
*G06F 17/50* (2006.01)
(52) U.S. Cl.
USPC ............................................................. 703/1
(58) Field of Classification Search
USPC ............................................................. 703/1
See application file for complete search history.

(56) References Cited

U.S. PATENT DOCUMENTS

| | | | |
|---|---|---|---|
| 2002/0065637 A1* | 5/2002 | Thompson et al. | 703/6 |
| 2002/0169586 A1* | 11/2002 | Rankin et al. | 703/1 |
| 2003/0039334 A1* | 2/2003 | Takada et al. | 378/210 |
| 2005/0091016 A1* | 4/2005 | Godavarthy et al. | 703/2 |
| 2005/0284937 A1* | 12/2005 | Xi et al. | 235/437 |
| 2006/0235566 A1* | 10/2006 | Lenz | 700/195 |

OTHER PUBLICATIONS

Antonia J. Spyridi et al., "Automatic programming of coordinate measuring machines," 1994, Proceedings of the 1994 IEEE International Conference on Robotics and Automation, pp. 1107-1112.*
Andy Wilson, "Model World," Jun. 1, 2009, Vision Systems Design, 11 pages.*

* cited by examiner

*Primary Examiner* — Kamini S Shah
*Assistant Examiner* — Russ Guill
(74) *Attorney, Agent, or Firm* — Altis Law Group, Inc.

(57) ABSTRACT

A method reads information of a three-dimensional (3D) product model and a light source model, and meshes the product model by multiple space triangles. The method further sets illumination parameters based on the information of product model and the light source model, simulates illuminated environment based on the illumination parameters, and projects the product model to a two-dimensional (2D) plane under the illuminated environment. 2D triangles matching the space triangles and 2D measurement points matching the 3D measurement points are determined in the 2D plane, and a measurement region is determined based on the 2D measurement points. Then, the 2D triangles in the measurement region are given colors based on illuminated effect produced by the illuminated environment, and point-selection tools are created for the 2D measurement points. At last, an off-line program is generated according to information of the measurement region and the point-selection tools.

14 Claims, 13 Drawing Sheets

2D measurement point A'

METHOD OF SIMULATING ILLUMINATED ENVIRONMENT FOR OFF-LINE PROGRAMMING

BACKGROUND

1. Technical Field

Embodiments of the present disclosure relates to three-dimensional (3D) measurement technology, and more particularly, to a method of simulating an illuminated environment for off-line measurement programming applied in 3D measurement field.

2. Description of Related Art

On-line programming provides the capability to create, modify and monitor program sequences and data while a programmable logical controller (PLC) is on-line and in the RUN mode. Off-line programming allows development and modification of programs on a computer without having to be connected to the PLC. In measurement field, off-line programming provides the capability to create vision measurement programs on any stand-alone computers without interrupting product inspection process on a metrology system, such as a 3D measurement machine. In fact, the product inspection performed by the metrology system is often done with help of an illuminated environment produced by light sources. However, the illumination factors are often neglected in the off-line programming.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
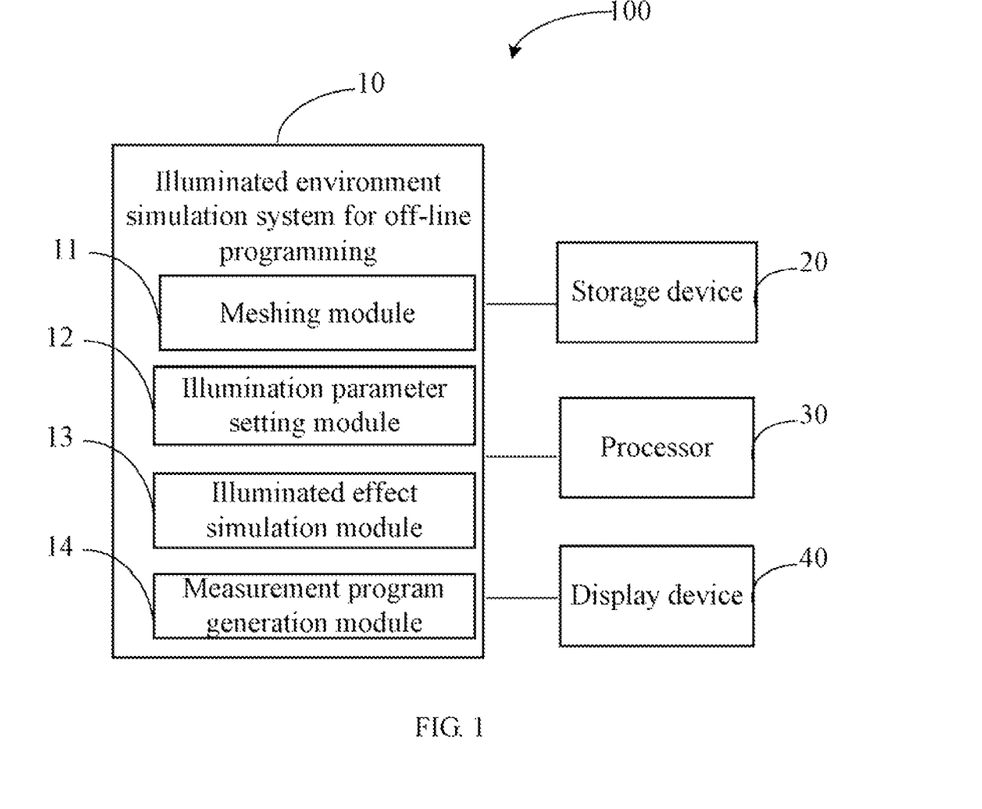
FIG. 1 is a block diagram of one embodiment of a data processing device for simulating an illuminated environment for off-line programming.

FIG. 1 is a block diagram of one embodiment of a data processing device 100 comprising an illuminated environment simulation system 10 for off-line programming (hereinafter, the system 10). The data processing device 100 may be a computer, or any other electronic device having data processing functions. An illuminated environment is an environment under which a product is to be measured and light shines on the product. In one embodiment, the system 10 simulates the illuminated environment for based on three-dimensional (3D) model information and a light source device provided for measurement of the product, and generates an off-line measurement program based on illuminated effect produced by the simulated illuminated environment.

As shown in FIG. 1, the system 10 includes a meshing module 11, an illumination parameter setting module 12, an illuminated effect simulation module 13, and a measurement program generation module 14. The modules 11-14 may comprise computerized code in the form of one or more programs (computer-readable program code) that are stored in a storage device 20 of the data processing device 100. The computerized code includes instructions that are executed by a processor 30 of the data processing device 10 to provide the below-described functions of the modules 11-14 illustrated in FIG. 2-FIG. 5. The storage system 20 may be a cache or a memory, such as an EPROM, HDD, or flash memory. The data processing device 100 further includes a display device 40 that displays the 3D models of the product and the light sources, and the simulated illuminated environment.

Figure 2:
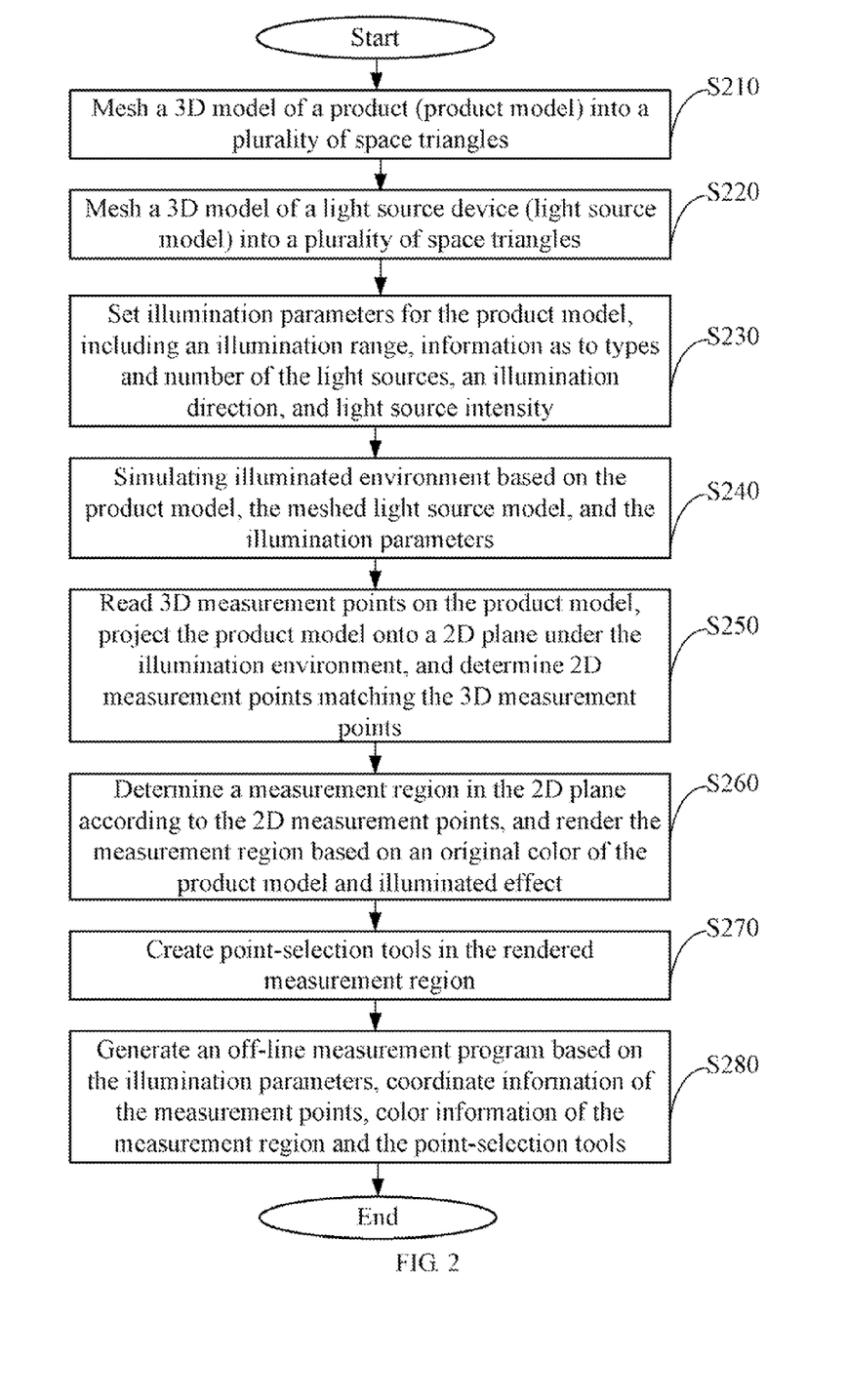
FIG. 2 is a flowchart of one embodiment of a method for simulating an illuminated environment for off-line programming.

FIG. 2 is a flowchart of one embodiment of a method for simulating an illuminated environment for off-line programming. Depending on the embodiment, additional blocks may be added, others removed, and the ordering of the blocks may be changed.

Figure 6A:
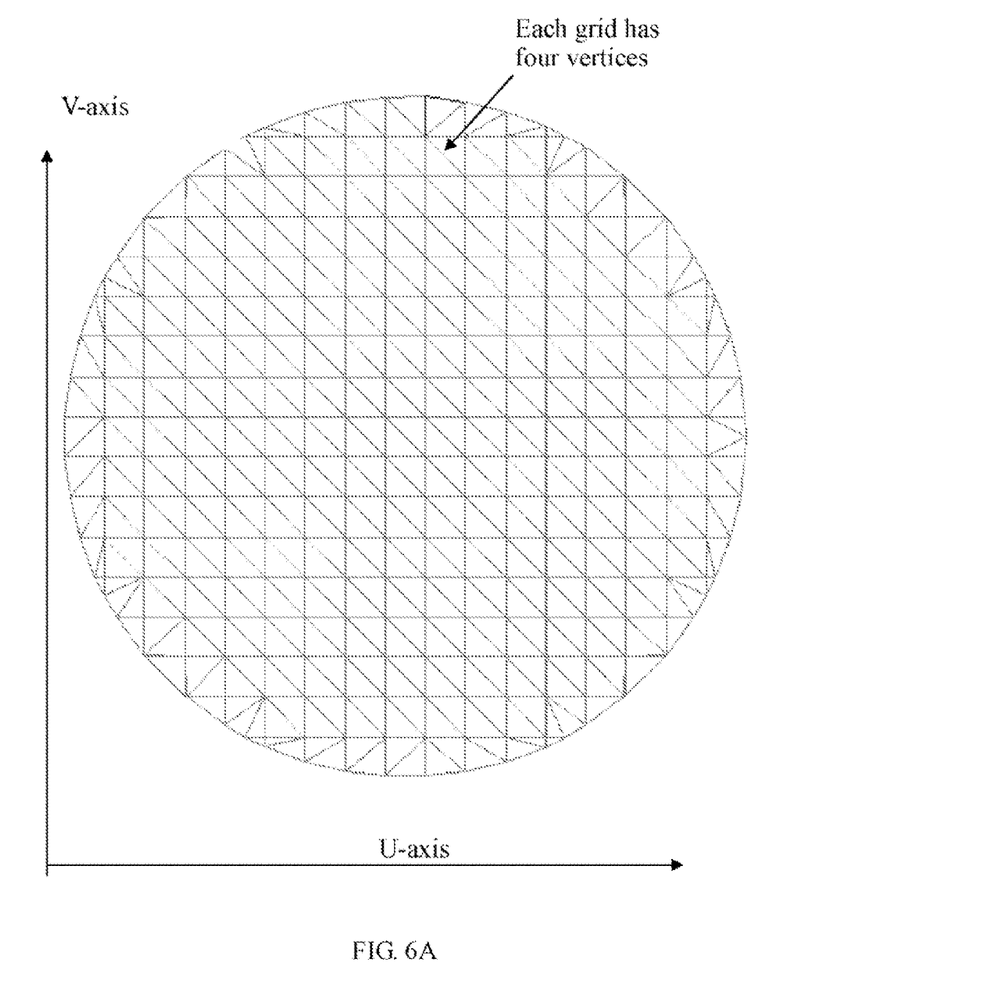
FIG. 6A and FIG. 6B illustrate triangulating a 3D product.

In block S210, the meshing module 11 reads information of a 3D model of the product (hereinafter "the product model") from the storage device 20, and meshes the product model into a plurality of triangles. In one embodiment, the information of the product model may include a parametric equation (i.e. $x=j(u,v)$, $y=\psi(u,v)$, $0<u,v<=1$) of the product model and an original color (e.g., yellow) of the product model. In this embodiment, the U-axis represents a horizontal direction, and the V-axis represents a vertical direction on the parameter plane (as shown in FIG. 6A). Vertices on the meshed product model may be expressed by 3D coordinates x, y, and z, or be expressed by the 2D parameters u and v. A detailed description about the meshing process is given in FIG. 3.

In block S220, the meshing module 11 reads information of a 3D model of the light source device (hereinafter "the light source model"), and meshes the light source model into a plurality of triangles. In one embodiment, the light source device may include a main light source and multiple assistant light sources surrounding the main light source. For example, the main light source may be a circular light, and the assistant sources may be light-emitting diodes. The information of the light source model may include information as to types and a number of the light sources, coordinate information of the center of each light source, and vector information on the surface of each light source. Meshing the 3D module of the light source device is similar to the process of meshing the product model, which may be referred to the detailed description given in FIG. 3.

In block S230, the illumination parameter setting module 12 sets illumination parameters for the product model based on the information of the product model and the light source model, including an illumination range, parameters as to types and number of the light sources, an illumination direction, parameters as to light source positions, and light source intensity parameters. In one embodiment, the light source intensity parameters may include an illumination depth and attenuation coefficients of points on the illumination depth. A detailed description is given in FIG. 4.

Figure 8:
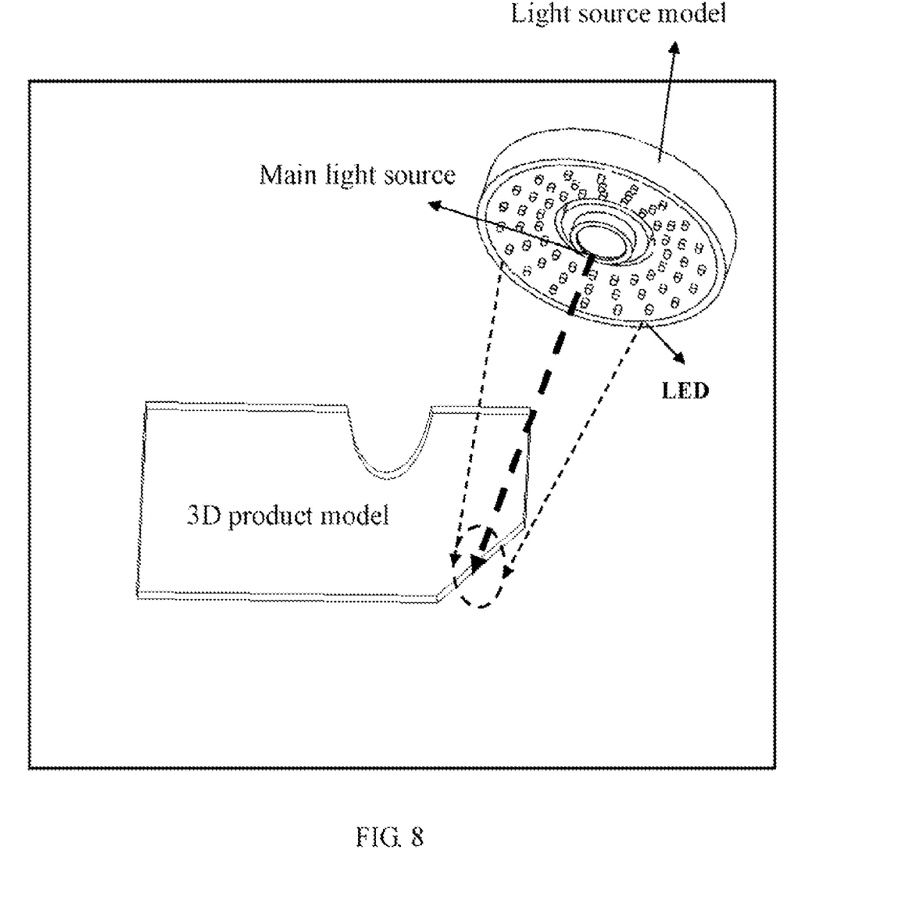
FIG. 8 illustrates simulating an illuminated environment for the 3D product.

In block S240, the illuminated effect simulation module 13 simulates illuminated environment for the product model based on the illumination parameters (as shown in FIG. 8).

Figure 7:
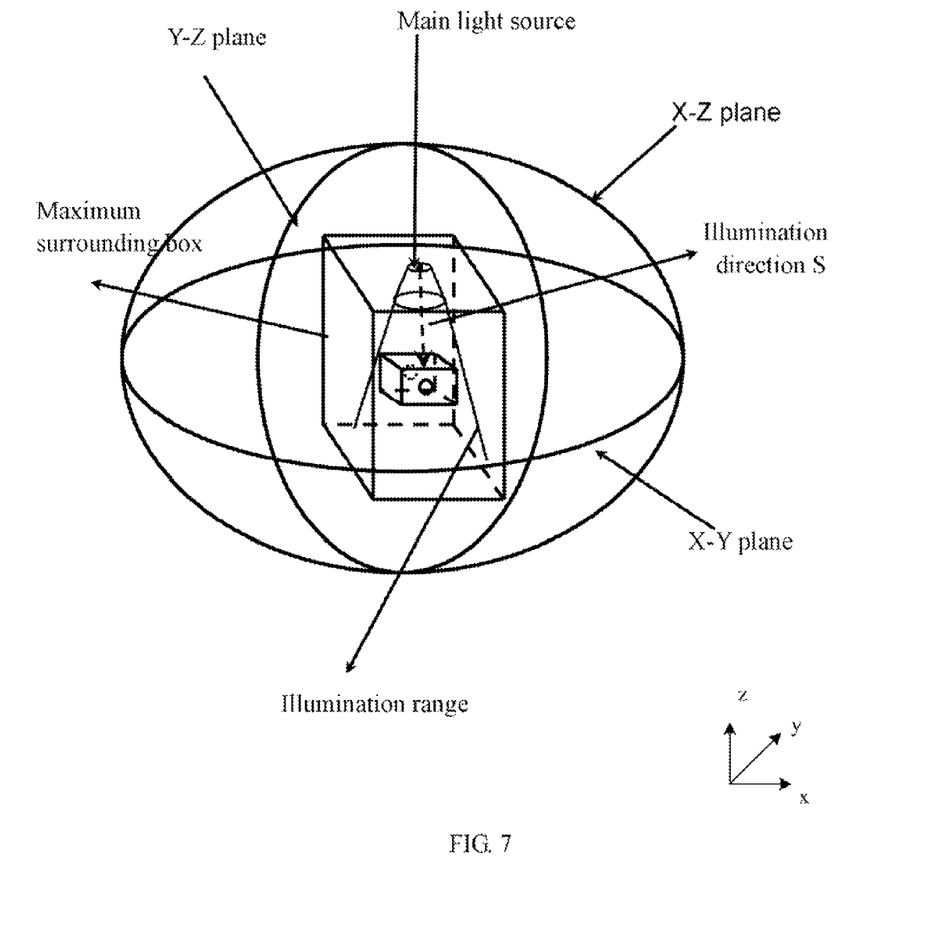
Figure 9:
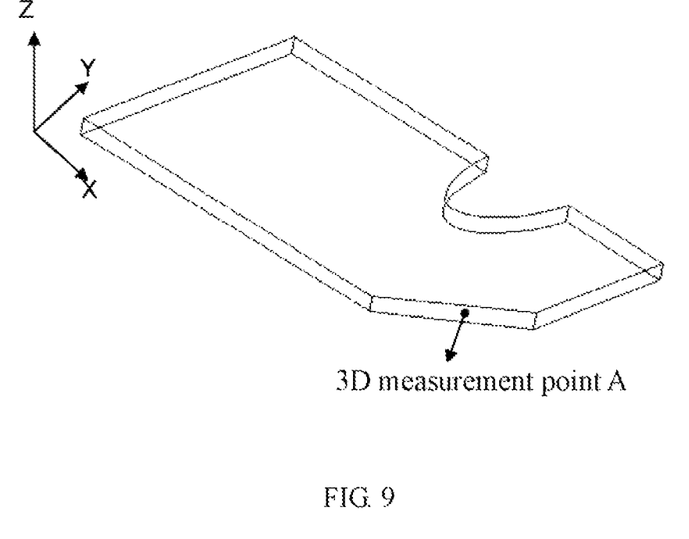
FIG. 9 illustrates 3D measurement points on the 3D product.
Figure 10:
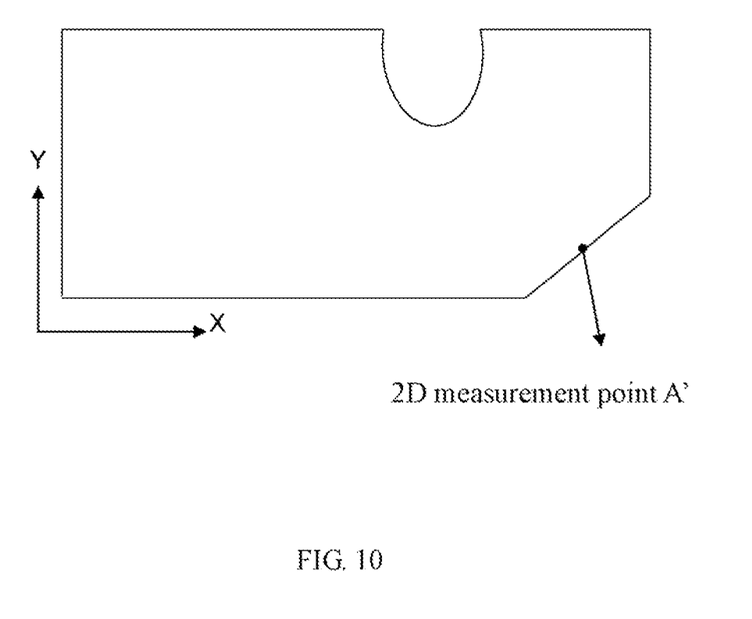
FIG. 10 illustrates 2D measurement points of the 3D product obtained by projecting the 3D object to a 2D work plane.

In block S250, the illuminated effect simulation module 13 reads 3D measurement points on the product model, projects the product model onto a 2D plane under the illuminated environment, and determines 2D measurement points matching the 3D measurement points. The 3D measurement points may be vertices of space triangles of the product model generated by the meshing process, or any other point on the product model. For example, as shown in FIG. 9, the point A is a 3D measurement point on the product model. The graph shown in FIG. 10 is a 2D model obtained by projecting the product model to a 2D plane, and the 2D point A' on the 2D model is a 2D measurement point that corresponds to the 3D measurement point A on the product model shown in FIG. 9. The 2D plane may be a X-Y plane, a Y-Z plane, or a X-Z plane, as shown in FIG. 7.

Figure 11:
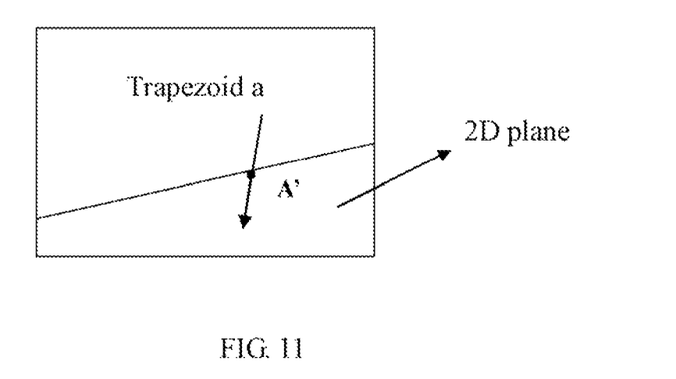
FIG. 11 illustrates a measurement region in the 2D plane.

In block S260, the illuminated effect simulation module 13 determines a measurement region in the 2D plane according to the 2D measurement points, renders the measurement region based on the original color of the product model and illuminated effect produced by the illuminated environment. As shown in FIG. 11, the rectangle represents the 2D plane, and the trapezoid a represents the measurement region. A detailed description of the rendering process is given in FIG. 5 described below.

In block S270, the measurement program generation module 14 creates point-selection tools in the rendered measurement region. A point-selection tool is used to mark a measurement point in the measurement region. The point-selection tool may be an arrow, a decussation, or any other graph type. For example, as shown in FIG. 11, the arrow is a point-selection tool of the 2D measurement point A'.

In block S280, the measurement program generation module 14 generates an off-line measurement program based on the illumination parameters, coordinate information of the measurement points, color information of the measurement region, and information of the point-selection tools. The coordinate information of the measurement points includes 3D coordinates of the 3D measurement points on the product model and 2D coordinates of the 2D measurement points in the 2D plane. The information of the point-selection tools includes types and sizes of the point-selection tools.

Figure 3:
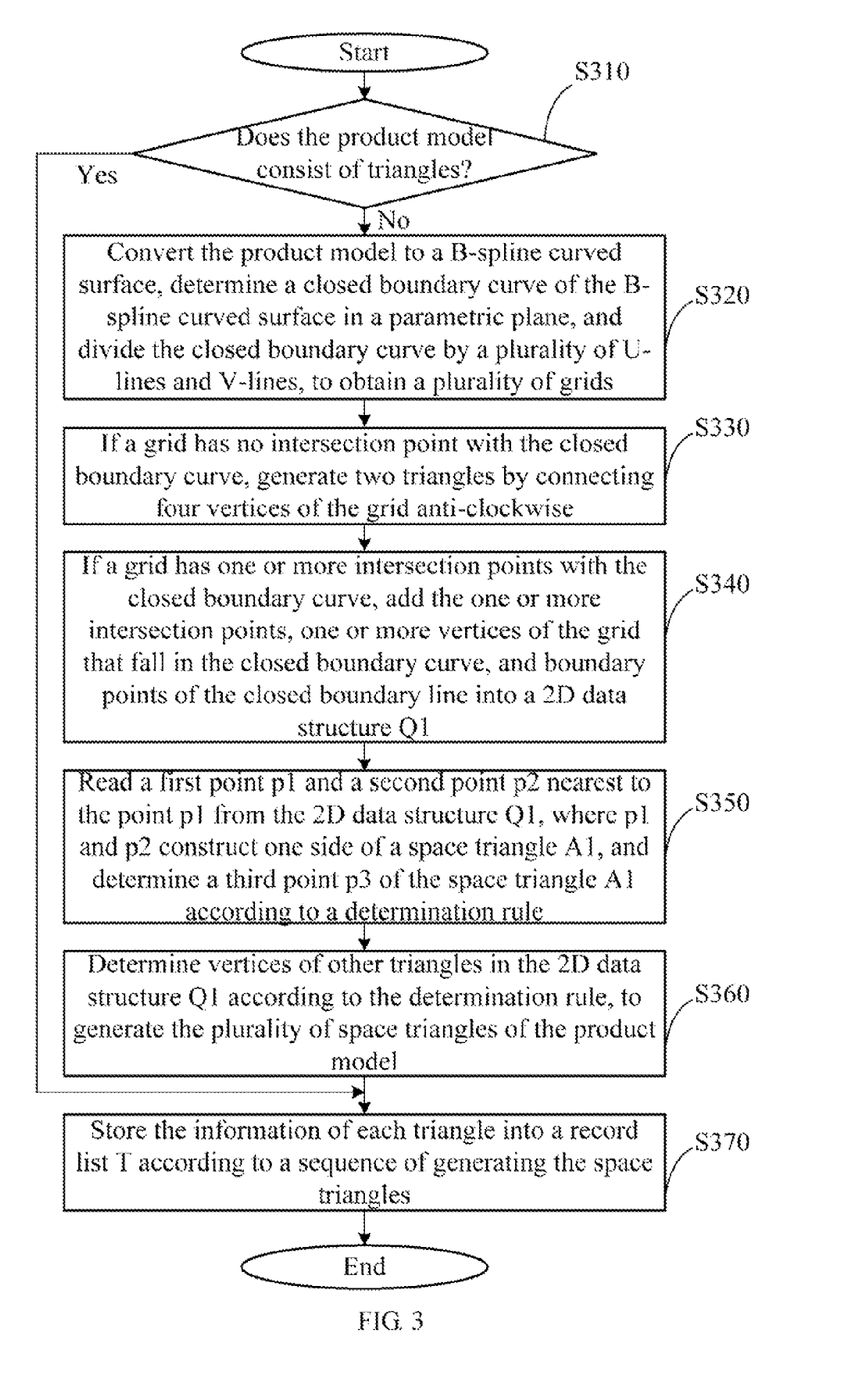
FIG. 3 is a detailed description of block S210 in FIG. 2.

FIG. 3 is a detailed description of block S210 in FIG. 2. Depending on the embodiment, additional blocks may be added, others removed, and the ordering of the blocks may be changed.

In block S310, the meshing module 11 reads the product model (e.g., a 3D model of a mobile phone) from the storage device 20, and determines that if the product model consists of triangles. If the product model consists of triangles, the procedure directly goes to S370. Otherwise, if the product model does not consist of triangles, the procedure goes to block S320.

In block S320, the meshing module 11 converts the product model to a B-spline curved surface, determines a closed boundary curve of the B-spline curved surface in a parametric plane, and divides the closed boundary curve by a plurality of horizontal lines (hereinafter referred to "U-lines") and vertical lines (hereinafter referred to "V-lines"), to obtain a plurality of grids (as shown in FIG. 6A).

Figure 6B:
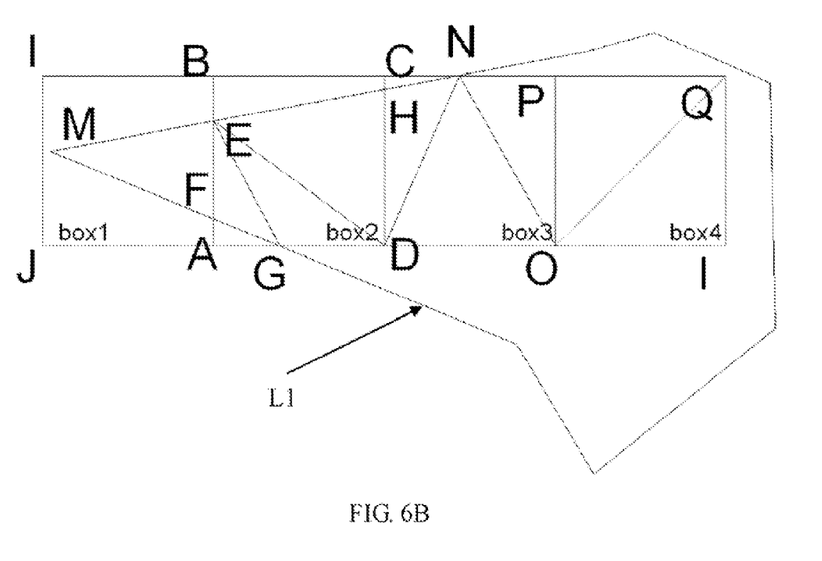

In block S330, if a grid has no intersection point with the closed boundary curve, the meshing module 11 generates two triangles by connecting four vertices of the grid anti-clockwise. For example, as shown in FIG. 6B, four vertices "P," "Q," "I," and "O" of a grid "box4" all fall within the closed boundary curve L1, then the meshing module 11 generates two triangles "OQP" and "OIQ" by connecting the four vertices "P," "Q," "I," and "O" anti-clockwise.

In block S340, if a grid has one or more intersection points with the closed boundary curve, the meshing module 11 adds the one or more intersection points, one or more vertices of the grid which fall within the closed boundary curve, and boundary points of the closed boundary line into a two-dimensional (2D) data structure Q1. For example, as shown in FIG. 6B, a boundary point "M" falls within a grid "box1," and the grid "box1" has two intersection points "E" and "F" with the closed boundary curve L1. A vertex "D" of a grid "box2" falls within the closed boundary curve L1, and the grid "box2" has four vertices "E," "F," "C," and "G" with the closed boundary curve L1. Then, the meshing module 11 adds the points "M," "E," "F," "C," "D," and "G" into the 2D data structure Q1.

In block S350, the meshing module 11 reads a first point p1 and a second point p2 nearest to the point p1 from the 2D data structure Q1, where p1 and p2 construct one side of a space triangle A1. The meshing module 11 further determines a third point p3 of the space triangle A1 according to a determination rule that there is no 2D point of the 2D data structure Q1 in a circumcircle of the space triangle A1 consisted by the points p1, p2, and p3.

In block S360, the meshing module 11 determines vertices of other space triangles in the 2D data structure Q1 according to the determination rule, to generate the plurality of space triangles of the product model.

In block S370, the meshing module 11 stores the information of each space triangle into a record list T according to a sequence of generating the space triangles.

Figure 4:
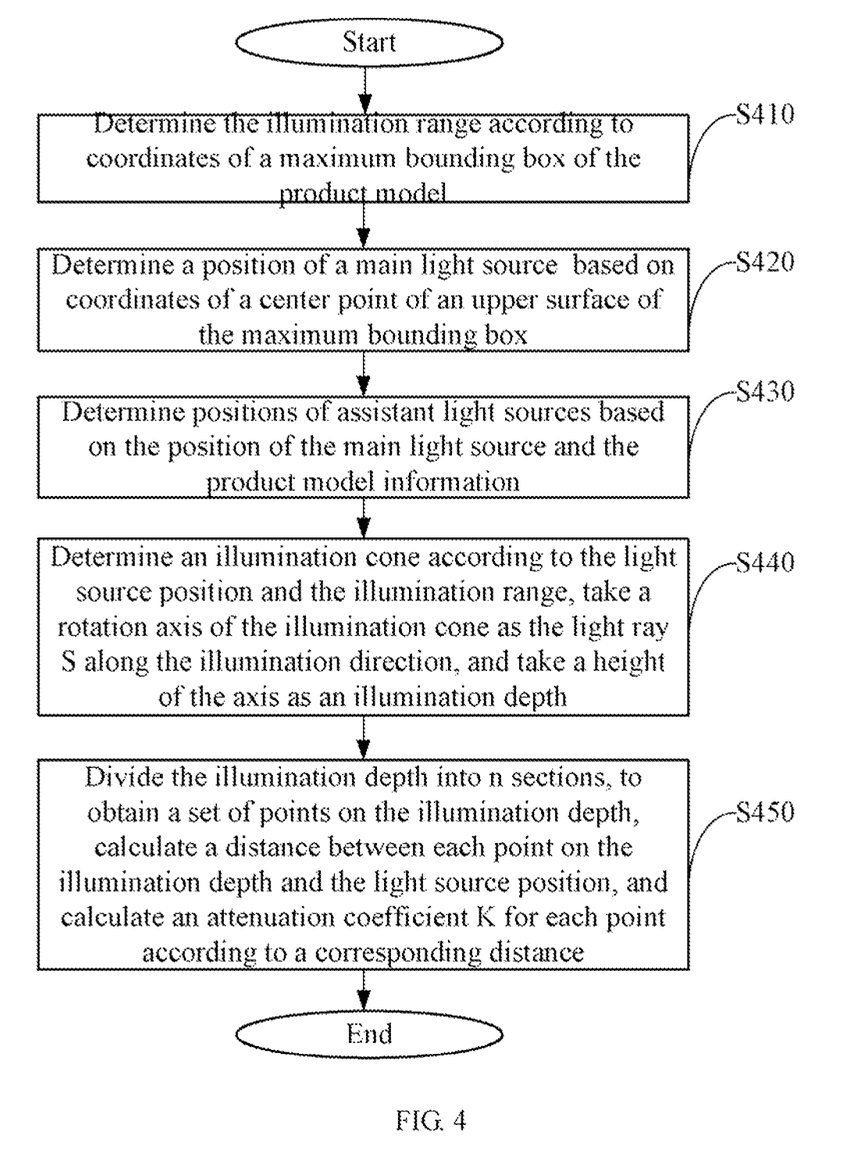
FIG. 4 is a detailed description of block S230 in FIG. 2.

FIG. 4 is a detailed description of block S230 in FIG. 2. Depending on the embodiment, additional blocks may be added, others removed, and the ordering of the blocks may be changed.

In block S410, the illumination parameter setting module 12 determines the illumination range according to coordinates of a maximum bounding box of the product model. The maximum bounding box of the product model is defined as a cuboid that surrounds the product model, and the product model still falls within the cuboid no matter the product model rotates by taking any point on the product model as the rotation pivot. For example, supposing the cuboid shown in FIG. 7 is the maximum bounding box of the triangulated product model, then the illumination range is defined by the cuboid.

In block S420, illumination parameter setting module 12 determines a position of a main light source (hereinafter, "the main light source position") according to coordinates of a center point of an upper surface of the maximum bounding box. For example, supposing coordinates of the center point of the upper surface of the cuboid in FIG. 7 is x1, y1, and z1, then the illuminated effect simulation module 13 determines the main light source position is (x1, y1, z1).

In block S430, the illumination parameter setting module 12 determines positions of the assistant light sources based on the main light source position and the product model information. As mentioned in the description of block S220 in FIG. 2, the information of the light source model includes the coordinate information of the center of each light source, and vector information on the surface of each light source. Relative position relationship of each two light sources, such as the main light source and an assistant light source, or two assistant light sources, may be determined according to the coordinate information of the center of each light source and the vector information of the two light sources. Then, the positions of the assistant light sources may be determined based on the main light source position and the relative position relationship.

In block S440, the illumination parameter setting module 12 determines a illumination cone according to the light source position and the illumination range, takes a rotation axis of the illumination cone as the light ray S along the illumination direction, and takes a height of the rotation axis as the illumination depth. For example, as shown in FIG. 7, the illumination parameter setting module 12 takes the main light source position as an original point and takes a distance between the upper surface and the lower surface of the maximum bounding box (i.e., the cuboid) as the height of the rotation axis to draw the illumination cone.

Figure 12:
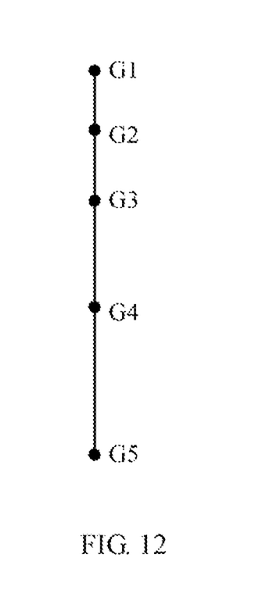
FIG. 12 illustrates dividing an illumination depth in block S450 of FIG. 4.

In block S450, the illumination parameter setting module 12 divides the illumination depth into n sections to obtain a set of points on the illumination depth, calculates a distance between each point on the illumination depth and the main light source position, and calculates an attenuation coefficient K for each point according to a corresponding distance. For example, as shown in FIG. 12, supposing the line segment G1G5 is the illumination depth, where the endpoint G1 is the main light source position. The illumination parameter setting module 12 divides the illumination depth G1G5 to four sections, to obtain the set of points G1, G2, G3, G4, and G5. The illumination parameter setting module 12 further calculates an attenuation coefficient K for the points G1, G2, G3, G4, and G5, where the attenuation coefficient K is a ratio of a distance between the point and the main light source position to the illumination depth. For example, K(G1)=0, K(G2)=|G1G2|/|G1G5|, K(G3)=|G1G3|/|G1G5|, K(G4)=|G1G4|/|G1G5|, and K(G5)=|G1G5|/|G1G5|=1, where "| |" represents an absolute value. For example, "|G1G2|" represents the absolute value of "G1G2."

Figure 5:
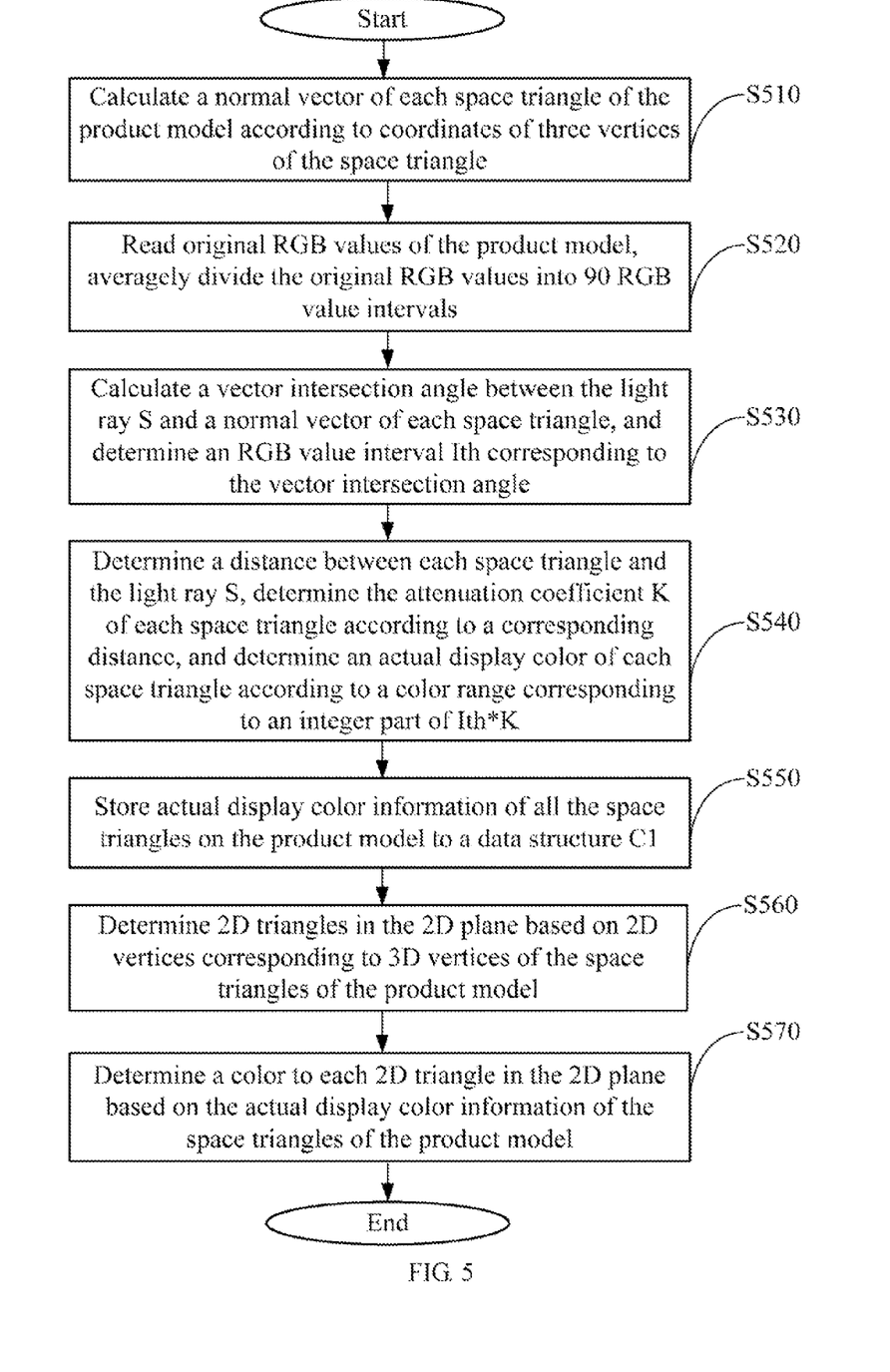
FIG. 5 is a detailed description of block S260 in FIG. 2.

FIG. 5 is a detailed description of block S260 in FIG. 2. Depending on the embodiment, additional blocks may be added, others removed, and the ordering of the blocks may be changed.

In block S510, the illuminated effect simulation module 13 calculates a normal vector of each space triangle of the product model according to coordinates of three vertices of the space triangle. For example, supposing three vertices of a space triangle A1 of the meshed product model are v0, v1, and v2, then the illuminated effect simulation module 13 calculates a normal vector N1 of the space triangle A1 as follows: N1=(v1−v0)cross(v2−v0), where "cross" represents the cross product.

In block S520, the illuminated effect simulation module 13 reads original red, green, and blue (RGB) values of the 3D object, and averagely divides the original RGB values into 90 RGB value intervals, so that each vector intersection angle corresponds to a corresponding RGB value interval. For example, if the original color of the 3D object is yellow, then the calculation module 15 divides RGB values of the yellow color to 90 RGB value intervals, to obtain 90 RGB values from light yellow to deep yellow. If a normal vector intersection angle between an object and a light source is more than 90 degrees, then the object is not visible with the eye, so that the original RGB values of the 3D object are divided to 90 RGB value intervals for following use.

In block S530, the illuminated effect simulation module 13 calculates a vector intersection angle between the light ray S and a normal vector of each space triangle, and determines a RGB value interval Ith corresponding to the vector intersection angle. For example, if the vector intersection angle a1 between the light ray S and the normal vector N1 of the space triangle A1 is 30.5 degrees, then the vector intersection angle a1 corresponds to the $30^{th}$ (i.e., Ith=$30^{th}$) RGB value interval.

In block S540, the illuminated effect simulation module 13 determines a distance between each space triangle and the light ray S, determines the attenuation coefficient K of each space triangle according to a corresponding distance, and determines an actual display color of each space triangle according to a RGB value interval corresponding to an integer part of Ith*K. For example, if the distance between the space triangle A1 and the light ray S is 8.1 cm, the illumination depth is 10 cm, then the attenuation coefficient K of the space triangle A1 is 0.81, and int(30*0.81)=24. That is, an actual display color of the space triangle A1 falls within the $24^{th}$ RGB value interval.

In block S550, the illuminated effect simulation module 13 stores actual color information of all the space triangles of the meshed product model into a data structure C1.

In block S560, the illuminated effect simulation module 13 determines 2D triangles in the 2D plane based on 2D vertices corresponding to 3D vertices of each space triangle of the meshed product model. For example, a 2D triangle B1, which corresponds to the space triangle A1, may be determined in the 2D plane.

In block S570, the illuminated effect simulation module 13 determines a color of each 2D triangle in the 2D plane based on the actual display color information of the space triangles of the product model. For example, the illuminated effect simulation module 13 determines the color of 2D triangle B1 is the same as the color of the space triangle A1.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method of simulating illuminated environment for off-line programming being performed by a processor of a data processing device, the method comprising:
   (a) reading information of a three-dimensional (3D) model of a product (product model) and a 3D model of a light source device (light source model) from a storage device, and respectively meshing the product model and the light source model into a plurality of space triangles;
   (b) setting illumination parameters for the product model based on the information of the product model and the light source model, the illumination parameters comprising an illumination range, parameters as to types and number of light sources, an illumination direction, parameters as to light source positions and light source intensity, wherein step (b) comprises:
   (b1) determining the illumination range according to coordinates of a maximum bounding box of the product model;
   (b2) determining a position of a main light source of the light source device according to coordinates of a center point of an upper surface of the maximum bounding box;
   (b3) determining positions of assistant light sources of the light source device based on the main light source position and the information of the light source model;

(b4) determining an illumination cone according to the position of the main light source and the illumination range, taking a rotation axis of the illumination cone as a light ray S along the illumination direction, and taking a height of the rotation axis as the illumination depth; and (b5) dividing the illumination depth into n sections to obtain a set of points on the illumination depth, calculating a distance between each point on the illumination depth and the main light source position, and calculating an attenuation coefficient K of each point according to a corresponding distance;

(c) simulating an illuminated environment for the product model based on the illumination parameters;

(d) reading 3D measurement points on the product model, projecting the product model onto a two-dimensional (2D) plane under the illuminated environment, and determining 2D measurement points matching the 3D measurement points;

(e) determining a measurement region in the 2D plane according to the 2D measurement points, and rendering the measurement region based on an original color of the product model and illuminated effect produced by the illuminated environment;

(f) creating point-selection tools in the rendered measurement region; and (g) generating an off-line measurement program based on the illumination parameters, coordinate information of the 2D measurement points and 3D measurement points, color information of the measurement region, and information of the point-selection tools.

2. The method as claimed in claim 1, wherein step (a) comprises:

(a1) converting the product model to a B-spline curved surface, determining a closed boundary curve of the B-spline curved surface in a parametric plane, and dividing the closed boundary curve by a plurality of horizontal lines (U-lines) and vertical lines (V-lines), to obtain a plurality of grids;

(a2) if a grid has no intersection point with the closed boundary curve, generating two triangles by connecting four vertices of the grid anti-clockwise;

(a3) if a grid has one or more intersection points with the closed boundary curve, adding the one or more intersection points, one or more vertices of the grid which fall within the closed boundary curve, and boundary points of the closed boundary line into a two-dimensional (2D) data structure Q1;

(a4) reading a first point p1 and a second point p2 nearest to the point p1 from the 2D data structure Q1, where p1 and p2 construct one side of a triangle A, and determining a third point p3 of the triangle A according to a determination rule that there is no 2D point of the 2D data structure Q1 in a circumcircle of the triangle A; and (a5) determining vertices of other triangles in the 2D data structure Q1 according to the determination rule, to generate the plurality of space triangles of the product model.

3. The method as claimed in claim 1, wherein the attenuation coefficient K of each point is a ratio of a distance between the point and the position of the main light source to the illumination depth.

4. The method as claimed in claim 1, wherein rendering the measurement region in step (e) comprises:

(e1) calculating a normal vector of each space triangle of the product model according to coordinates of three vertices of the space triangle;

(e2) reading original red, green, and blue (RGB) values of the product model, and averagely dividing the original RGB values into 90 RGB value intervals, so that each vector intersection angle corresponds to a corresponding RGB value interval;

(e3) calculating a vector intersection angle between the light ray S and a normal vector of each space triangle, and determining an RGB value interval Ith corresponding to the vector intersection angle;

(e4) determining a distance between each space triangle and the light ray S, determining the attenuation coefficient K of each space triangle according to a corresponding distance, and determining an actual display color of each space triangle according to an RGB value interval corresponding to an integer part of Ith*K;

(e5) determining 2D triangles in the 2D plane based on 2D vertices corresponding to 3D vertices of each space triangle of the meshed product model; and (e6) determining a color of each 2D triangle in the 2D plane based on the actual display color of the space triangles of the product model.

5. The method as claimed in claim 4, wherein the original RGB values are divided into 90 RGB value intervals according to a rule that an object is visible under the condition that a normal vector intersection angle between the object and the light source is less than 90 degrees.

6. The method as claimed in claim 1, wherein the maximum bounding box of the product model is defined as a cuboid that surrounds the product model, and the product model still falls within the cuboid no matter the product model rotates by taking any point on the product model as a rotation pivot.

7. The method as claimed in claim 1, wherein the light source device consists of a main light source and multiple assistant light sources surrounding the main light source, and the information of the light source model comprises information as to types and number of the light sources, coordinate information of the center of each light source, and vector information on the surface of each light source.

8. A non-transitory storage medium storing a set of instructions, the set of instructions capable of being executed by a processor of a data processing device to perform a method of simulating illuminated environment for off-line programming, the method comprising:

(a) reading information of a three-dimensional (3D) model of a product (product model) and a 3D model of a light source device (light source model) from a storage device, and respectively meshing the product model and the light source model into a plurality of space triangles;

(b) setting illumination parameters for the product model based on the information of product model and the light source model, the illumination parameters comprising an illumination range, parameters as to types and number of light sources, an illumination direction, parameters as to light source positions and light source intensity, wherein step (b) comprises:

(b1) determining the illumination range according to coordinates of a maximum bounding box of the product model;

(b2) determining a position of a main light source of the light source device according to coordinates of a center point of an upper surface of the maximum bounding box;

(b3) determining positions of assistant light sources of the light source device based on the main light source position and the information of the light source model;

(b4) determining an illumination cone according to the position of the main light source and the illumination range, taking a rotation axis of the illumination cone as a light ray S along the illumination direction, and taking a height of the rotation axis as the illumination depth; and (b5) dividing the illumination depth into n sections to obtain a set of points on the illumination depth, calculating a distance between each point on the illumination depth and the main light source position, and calculating an attenuation coefficient K of each point according to a corresponding distance;

(c) simulating an illuminated environment for the product model based on the illumination parameters;

(d) reading 3D measurement points on the product model, projecting the product model onto a two-dimensional (2D) plane under the illuminated environment, and determining 2D measurement points matching the 3D measurement points;

(e) determining a measurement region in the 2D plane according to the 2D measurement points, and rendering the measurement region based on an original color of the product model and illuminated effect produced by the illuminated environment;

(f) creating point-selection tools in the rendered measurement region; and (g) generating an off-line measurement program based on the illumination parameters, coordinate information of the 2D measurement points and 3D measurement points, color information of the measurement region, and information of the point-selection tools.

9. The storage medium as claimed in claim 8, wherein step (a) comprises:

(a1) converting the product model to a B-spline curved surface, determining a closed boundary curve of the B-spline curved surface in a parametric plane, and dividing the closed boundary curve by a plurality of horizontal lines (U-lines) and vertical lines (V-lines), to obtain a plurality of grids;

(a2) if a grid has no intersection point with the closed boundary curve, generating two triangles by connecting four vertices of the grid anti-clockwise;

(a3) if a grid has one or more intersection points with the closed boundary curve, adding the one or more intersection points, one or more vertices of the grid which fall within the closed boundary curve, and boundary points of the closed boundary line into a two-dimensional (2D) data structure Q1;

(a4) reading a first point p1 and a second point p2 nearest to the point p1 from the 2D data structure Q1, where p1 and p2 construct one side of a triangle A, and determining a third point p3 of the triangle A according to a determination rule that there is no 2D point of the 2D data structure Q1 in a circumcircle of the triangle A; and (a5) determining vertices of other triangles in the 2D data structure Q1 according to the determination rule, to generate the plurality of space triangles of the product model.

10. The storage medium as claimed in claim 8, wherein the attenuation coefficient K of each point is a ratio of a distance between the point and the position of the main light source to the illumination depth.

11. The storage medium as claimed in claim 8, wherein rendering the measurement region in step (e) comprises:

(e1) calculating a normal vector of each space triangle of the product model according to coordinates of three vertices of the space triangle;

(e2) reading original red, green, and blue (RGB) values of the product model, and averagely dividing the original RGB values into 90 RGB value intervals, so that each vector intersection angle corresponds to a corresponding RGB value interval;

(e3) calculating a vector intersection angle between the light ray S and a normal vector of each space triangle, and determining an RGB value interval Ith corresponding to the vector intersection angle;

(e4) determining a distance between each space triangle and the light ray S, determining the attenuation coefficient K of each space triangle according to a corresponding distance, and determining an actual display color of each space triangle according to an RGB value interval corresponding to an integer part of Ith*K;

(e5) determining 2D triangles in the 2D plane based on 2D vertices corresponding to 3D vertices of each space triangle of the meshed product model; and (e6) determining a color of each 2D triangle in the 2D plane based on the actual display color of the space triangles of the product model.

12. The storage medium as claimed in claim 11, wherein the original RGB values are divided into 90 RGB value intervals according to a rule that an object is visible under the condition that a normal vector intersection angle between the object and the light source is less than 90 degrees.

13. The storage medium as claimed in claim 8, wherein the maximum bounding box of the product model is defined as a cuboid that surrounds the product model, and the product model still falls within the cuboid no matter the product model rotates by taking any point on the product model as a rotation pivot.

14. The storage medium as claimed in claim 8, wherein the light source device consists of a main light source and multiple assistant light sources surrounding the main light source, and the information of the light source model comprises information as to types and number of the light sources, coordinate information of the center of each light source, and vector information on the surface of each light source.

* * * * *